United States Patent [19]
Reyes

[11] Patent Number: 5,892,178
[45] Date of Patent: Apr. 6, 1999

[54] SUPPORT FIXTURE FOR CONTROL PANEL ASSEMBLY

[75] Inventor: Theodore Robert Reyes, San Diego, Calif.

[73] Assignee: Qualcomm Incorporated, San Diego, Calif.

[21] Appl. No.: 822,194

[22] Filed: Mar. 20, 1997

[51] Int. Cl.⁶ .................................................. H01B 17/00
[52] U.S. Cl. ..................... 174/138 G; 361/809; 439/76.1
[58] Field of Search ........................... 174/138 G, 138 E, 174/138 D, 52.1, 52.4; 361/784, 790, 804, 807, 809, 753, 758, 737, 816; 439/76.1; 52/220.8, 28

[56] References Cited

U.S. PATENT DOCUMENTS

| | | | |
|---|---|---|---|
| 2,990,465 | 6/1961 | Dumke | 200/293 |
| 4,158,450 | 6/1979 | Suzuki | 248/694 |
| 4,195,193 | 3/1980 | Grabbe et al. | 174/52.4 |
| 4,480,150 | 10/1984 | Jones et al. | 174/52.4 |
| 4,722,027 | 1/1988 | Hayakawa | 361/783 |
| 4,760,659 | 8/1988 | Watabe | 40/124.02 |
| 5,140,298 | 8/1992 | Gordon et al. | 338/226 |
| 5,563,770 | 10/1996 | Bethurum | 361/737 |

*Primary Examiner*—Kristine Kincaid
*Assistant Examiner*—Dhiru R Patel
*Attorney, Agent, or Firm*—Russell B. Miller; Sean English; Bruce W. Greenhaus

[57] ABSTRACT

A support fixture for supporting a face plate and CCA board as they are secured together has a base plate and a pair of end supports or blocks projecting upwardly from opposite ends of the base plate to support opposite ends of the face plate. A center support also projects upwardly from the base plate at a location spaced centrally between the two end supports for supporting a central region of the face plate. The end supports have rectangular recesses at the same height as the center support for receiving the opposite ends of the face plate. The height of the recesses and center support is selected to be greater than the height of any LED projecting from the CCA board through openings in the face plate, such that any such LED is spaced above the base plate.

12 Claims, 1 Drawing Sheet

SUPPORT FIXTURE FOR CONTROL PANEL ASSEMBLY

BACKGROUND OF THE INVENTION

I. Field of the Invention

The present invention relates generally to control panel or alarm panel assembly and is particularly concerned with a support fixture for use during attachment of a control panel face plate to a printed wiring board or circuit card assembly (CCA) board.

II. Description of the Related Art

Control panels are typically provided with light emitting diodes (LEDs) which light up when various conditions, such as alarm conditions, are met. Such panels typically have a metal face plate with openings through which LEDs project from a printed wiring board secured to the rear side of the face plate. One problem in assembly of such control panels is that it is difficult to secure the printed wiring board or CCA board to the face plate without resting either the electronic components on the inside of the board or the LEDs against a support surface, which may potentially damage the components, particularly the relatively fragile LEDs.

SUMMARY OF THE INVENTION

It is an object of the present invention to provide a new and improved fixture for supporting two parts, such as a face plate and printed wiring board, during assembly.

According to one aspect of the present invention, a support fixture is provided for supporting a face panel and CCA board while they are secured together. The fixture comprises a rectangular base plate having an upper surface, a lower surface, and opposite first and second ends, a first end support projecting upwardly from the upper surface of the base plate at the first end of the base plate, a second end support projecting upwardly from the upper surface at the second end of the base plate, and a center support projecting upwardly from the upper surface at a central location between the first and second end supports, the end supports and center support each having an upper surface aligned with the upper surface of the other supports for supporting a face plate and a CCA board placed on top of the face plate as the board and plate are secured together. The spacing between the end supports is of predetermined length less than the length of the face plate, and the height of the supports is greater than the height of any component extending from the board through openings in the face plate, whereby the components are supported above the base plate as the plate and board are secured together.

Preferably, the end and central supports are of a non-abrasive material such as plastic, so that the face plate, which is normally painted, is not scratched or damaged during the attachment procedure. In a preferred embodiment of the invention, each end support has a generally rectangular recess or cut-out in its upper end, the recess forming a ledge having an open end facing the other end support, the recess or ledge forming the support surface for receiving one end of the face plate and superimposed CCA board, and holding the parts against lateral shifting during assembly. The base plate may be of metal or other relatively rigid material.

This fixture will permit a face plate and CCA board to be supported and held together easily during attachment, while preventing the LEDs from contacting any support surface during the procedure. The opposite ends of the face plate and board are placed in the recesses in the opposite end supports, which are dimensioned to match the dimensions of the plate and board ends, and define a containment area of length substantially equal to the total length of the face plate and superimposed board. The central support helps to hold up the center of the plate and board against sagging. Any components, such as LEDs, which extend downwardly through openings provided for that purpose in the face plate will be spaced above the base plate and therefore will be protected against damage during the attachment procedure.

According to another aspect of the present invention, a method of supporting a face plate and CCA board during attachment is provided, which comprises the steps of placing the opposite ends of a face plate on recessed support surfaces on a pair of spaced end supports projecting upwardly from a base plate, positioning a circuit card assembly board on top of the fact plate so that predetermined components on the board project downwards through openings in the face plate and are suspended above the base plate, supporting a central region of the face plate and CCA board on a center support projecting upwardly from the base plate, and securing the face plate to the CCA board.

With this arrangement, the face plate and CCA board are readily supported in a stable position with the LEDs projecting through the face plate and raised above the base plate while the parts are secured together, reducing the risk of damage to any components during assembly. By placing opposite ends of the panel and board in recesses of dimensions matching the end dimensions, the panel and board are also held against lateral displacement during attachment.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
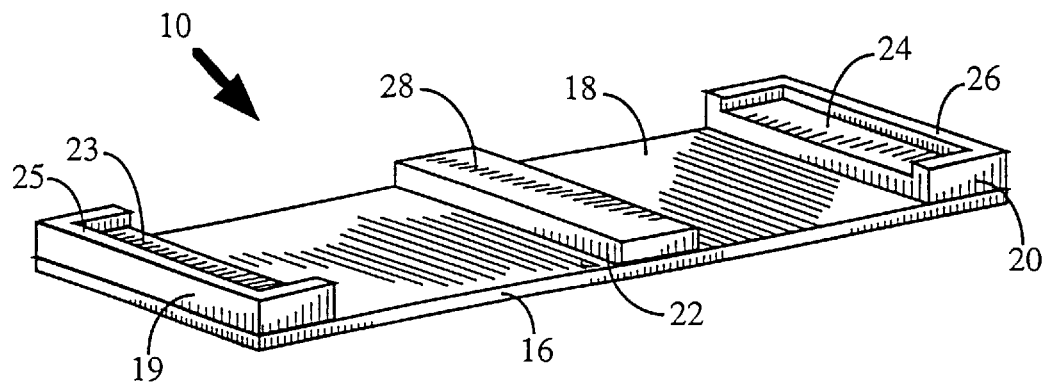
FIG. 1 is a perspective view of the support fixture according to a preferred embodiment of the invention.
Figure 2:
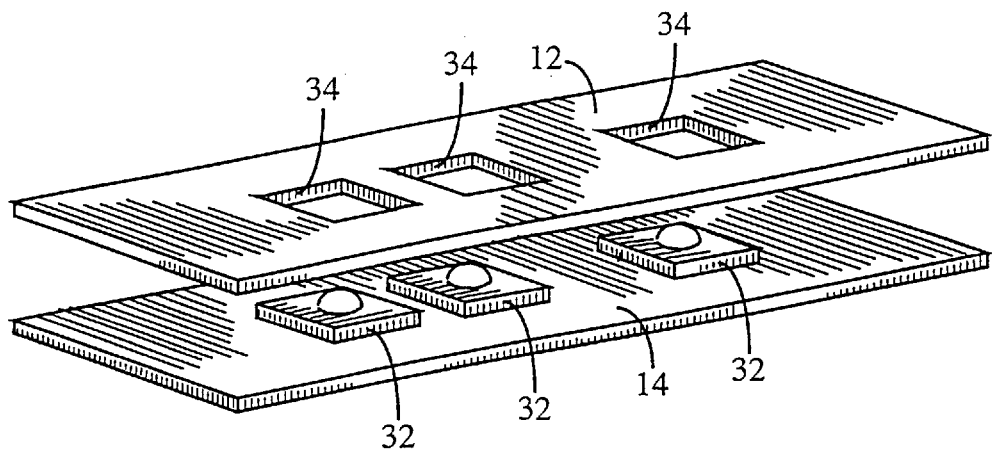
FIG. 2 illustrates a typical circuit board and face panel prior to assembly.

FIG. 1 illustrates a support fixture 10 according to a preferred embodiment of the present invention, which is specifically designed to support a face plate 12 and a circuit card assembly (CCA) board 14 as illustrated in FIG. 2 as these parts are secured together during a control panel installation. Fixture 10 basically comprises a flat, rectangular base plate 16 having an upper face 18, a lower face 77 (FIG. 2), a pair of end supports 19, 20 projecting upwardly from the upper face at opposite ends of the base plate 16, and a center support 22 projecting upwardly from the upper face at the center of the base plate.

The base plate is preferably of sheet metal, such as aluminum, and has a width and length slightly greater than that of the face plate 12. The end supports 19, 20 and center support 22 are each of a non-abrasive, smooth material which is softer than the metal face panel 12, such as plastic. The end supports 19, 20 and center support 22 are suitably bonded to the base plate with an adhesive, or alternatively may be secured by suitable fasteners such as screw fasteners.

Figure 3:
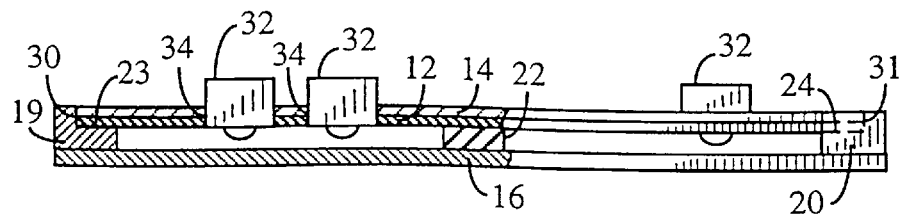
FIG. 3 is a side elevation view, partially cut away, showing the circuit board and backing plate supported in the fixture.

Each end support 19, 20 is a generally rectangular block of material having a generally rectangular recess 23, 24, respectively, formed in its upper surface. Each recess 23, 24 is open at its forward or inner end and has a three-sided peripheral rim 25, 26, respectively. The center support 22 is a web or rib extending transversely across the full width of base plate 16, and having an upper flat surface 28 aligned with the respective recesses 23, 24, as best illustrated in FIG. 3, which together form support surfaces for the face plate 12 and CCA board 14. The spacing between the end supports 19, 20 (shown in FIG. 3 as "b") and the dimensions of the recesses 23, 24 are selected such that the recesses 23, 24 together define a planar area of dimensions substantially equal to, or slightly greater than, the dimensions of the face plate 12. In other words, the distance between the inner end walls 30, 31 of the recesses is substantially equal to, or slightly greater than, the length of the face plate, while the width of each recess is substantially equal to the width of the face plate. The depth of each recess is substantially equal to the combined thickness of the face plate and CCA board when they are placed in face-to-face engagement, as in FIG. 3.

FIG. 3 illustrates how the support fixture is used to support a face plate 12 and a CCA board 14 during assembly to form a control panel or site alarm panel. CCA boards for control panels typically have a plurality of light emitting diodes or LEDs 32 which are designed to project through suitable openings 34 provided in the face plate 12, so as to provide an appropriate alarm signal or indication of other system conditions for operator monitoring of the system. The face plate 12 is first placed onto the support fixture with its opposite ends seated in recesses 23 and 24 and its central portion supported on central support 22. The CCA board is then placed over the face plate so that each LED 32 projects through the corresponding opening 34, as illustrated in FIG. 3. At this point both the face plate and the CCA board are fully seated in recesses 23, 24 at their opposite ends, and the two parts are therefore held against lateral shifting. The height of the recesses 23, 24 and center support 22 (shown in FIG. 3 as "a") is greater than the height of the LEDs 32 on board 14, such that when the plate and board are positioned in the support fixture as illustrated in FIG. 3, the LEDs 32 will all be raised above the base plate 16 and will not touch any surface. When the plate and board are positioned as in FIG. 3, they will be held in position so that they can be suitably secured together by any suitable securing device, such as adhesive or screw fasteners.

The dimensions of the fixture 10 will be selected according to the dimensions of the face plate and board to be supported. In one particular example, for a control panel of dimensions around 25 inches by 6 inches, the base plate 16 had dimensions of 25.55 inches by 6.62 inches. The end supports 19, 20 each had a height of 1 inch and cross-sectional dimensions of 2.25 inches by 6.62 inches. Each recess had a depth of 0.25 inches and the peripheral rim had a width of 0.25 inches, with the recess dimensions being 2 inches by 6.12 inches. The height of center support 22 was 0.75 inches, so that it was level with the base of each of the recesses which were recessed 0.25 inches below the upper surface of their peripheral rims. The thickness of the center support 22 was of the order of 0.5 inches to 1.5 inch, preferably around 1 inch. The center support was spaced at an equal distance, preferably in the range from 9 inches to 11 inches, from each of the end supports. The center support ensures that the plate and board will be adequately supported against bowing downwards at the center and potentially causing an LED to touch the base plate. The center support will prevent any such bowing. It will be understood that the dimensions of fixture 10 may alternatively be varied to fit any two parts to be secured together in an equivalent manner.

The base plate of the fixture has a length and width slightly greater than that of the face plate to be supported, preferably in the range of 0.25 to 0.75 inches greater than the corresponding dimension of the face plate. The recesses together define a rectangular space of dimensions slightly greater than the corresponding dimensions of the face plate. This ensures that the face plate and superimposed CCA board will be held against lateral movement during attachment. At the same time, any LEDs are shielded and held above the base plate, so that they are protected against any potential damage during the attachment procedure.

This fixture will make attachment of any face plate to a CCA or printed wiring board considerably easier and less liable to cause damage to the circuit components or LEDs. Since the end supports and center support are of a non-abrasive material such as plastic, damage or scratching to the painted outer face of the plate 12 is avoided. Although the end and center supports are formed entirely of plastic in the preferred embodiment, they may alternatively be of metal with a suitable non-abrasive coating on their upper, support surfaces.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A support fixture for supporting first and second parts during assembly, the first part having a length, comprising:

a rectangular base plate having an upper surface, a lower surface, and opposite ends;

a pair of end supports projecting upwardly from the upper surface at said opposite ends of the base plate;

a center support projecting upwardly from the upper surface at a central region spaced between the end supports;

the end supports and said center support each having an upper contact surface, said upper contact surface of said center support is aligned with both said upper contact surfaces of said end supports, said contact surfaces spaced a first predetermined distance above said base plate; and the end supports being spaced apart by a second predetermined distance less than the length of the first part to be supported on the fixture during attachment to said second part placed on top of the first part, whereby opposite end portions of the first part are placed on the end supports, a central region of the first part is supported on the center support, and the first and second parts are supported at said first predetermined distance above said upper surface of the base plate.

2. The fixture as claimed in claim 1, wherein each end support comprises a generally rectangular block of material, an upper end face of each rectangular block having a rectangular recess with a three-sided peripheral rim and an open side facing the other rectangular block, each said contact surface of said end supports also defined by a bottom of each said recess, said recesses receive said opposite end portions of said first part.

3. The fixture as claimed in claim 1, wherein said center support comprises a flat, rib-like member extending transversely across said base plate.

4. The fixture as claimed in claim 1, wherein said end and center supports are each of plastic material.

5. The fixture as claimed in claim 4, wherein said base plate is of metal.

6. The fixture as claimed in claim 1, wherein at least one component is placed on said second part, each component projecting a third predetermined distance within a space defined between said first part and said base plate, said first predetermined distance is greater than said third predetermined distance.

7. The fixture as claimed in claim 6, wherein said first predetermined distance is in the range from 0.5 inches to 1.5 inches.

8. The fixture as claimed in claim 7, wherein said first predetermined distance is approximately 1.0 inch.

9. The fixture as claimed in claim 1, wherein the base plate has a width in the range from 6.0 inches to 7.0 inches and a length in the range from 24 inches to 27 inches.

10. The fixture as claimed in claim 1, wherein the center support is spaced at an equal distance from each of said end supports.

11. The fixture as claimed in claim 10, wherein the center support is at a spacing in the range from 9 inches to 11 inches from each of said end supports.

12. A method of supporting a face plate and circuit card assembly board during attachment, comprising the steps of:

positioning opposite ends of a face plate in recesses on upper ends of a pair of spaced end supports projecting upwardly from a base plate;

supporting the face plate on the end supports and a center support projecting upwardly from a central region of the base plate to a position level with the recesses;

placing a circuit card assembly board on top of the face plate with components on the board projecting downwardly through openings in the face plate, the end supports and center support supporting the face plate and board so that all downwardly projecting components are spaced above the base plate; and securing the face plate to the circuit card assembly board.

* * * * *